(12) United States Patent
Champoux

(10) Patent No.: US 10,379,158 B2
(45) Date of Patent: Aug. 13, 2019

(54) REAL-TIME CAPTURE OF TRAFFIC UPON FAILURE FOR PROTOCOL DEBUG

(71) Applicant: Advantest Corporation, Tokyo (JP)

(72) Inventor: Duane Champoux, San Jose, CA (US)

(73) Assignee: ADVANTEST CORPORATION, Tokyo (JP)

( * ) Notice: Subject to any disclaimer, the term of this patent is extended or adjusted under 35 U.S.C. 154(b) by 52 days.

(21) Appl. No.: 15/429,034

(22) Filed: Feb. 9, 2017

(65) Prior Publication Data

US 2018/0224502 A1    Aug. 9, 2018

(51) Int. Cl.
*G01R 31/00* (2006.01)
*G01R 31/3177* (2006.01)
*G06F 11/27* (2006.01)
*G06F 11/26* (2006.01)

(52) U.S. Cl.
CPC .......... *G01R 31/3177* (2013.01); *G06F 11/26* (2013.01); *G06F 11/27* (2013.01)

(58) Field of Classification Search
None
See application file for complete search history.

(56) References Cited

U.S. PATENT DOCUMENTS

| | | | |
|---|---|---|---|
| 5,287,363 A | 2/1994 | Wolf et al. | |
| 5,668,745 A * | 9/1997 | Day | G01B 31/318307 702/121 |
| 7,417,449 B1 * | 8/2008 | Posey | G01R 31/31917 324/750.3 |
| 7,543,198 B2 | 6/2009 | Ferrante et al. | |
| 8,627,158 B2 | 1/2014 | Cadigan et al. | |
| 9,905,483 B2 * | 2/2018 | Arnold | H01L 22/20 |
| 9,952,276 B2 * | 4/2018 | Frediani | G01R 31/2834 |
| 2003/0208597 A1 | 11/2003 | Belgaied | |
| 2004/0237004 A1 * | 11/2004 | Adkisson | G06F 11/348 714/47.2 |
| 2004/0268181 A1 * | 12/2004 | Wang | G01R 31/318586 714/30 |
| 2010/0260204 A1 | 10/2010 | Pepper et al. | |
| 2013/0070584 A1 | 3/2013 | Hutchison et al. | |
| 2014/0244204 A1 * | 8/2014 | Frediani | G01R 31/00 702/119 |
| 2014/0269337 A1 | 9/2014 | Gintis | |
| 2014/0324378 A1 * | 10/2014 | Elston | G06F 11/263 702/123 |
| 2016/0072686 A1 | 3/2016 | Olgaard et al. | |
| 2017/0163358 A1 * | 6/2017 | Wadell | H04B 17/29 |

* cited by examiner

*Primary Examiner* — Daniel F. McMahon

(57) ABSTRACT

An automated test equipment for simultaneous testing of multiple devices includes a traffic capture circuit configured to capture communications with a device under test, a capture memory configured to store the communications captured by the traffic capture circuit, and a routing logic configured to read the communications from the capture memory, e.g., random access memory (RAM). There may be one of each of the traffic capture circuit, the capture RAM, and the routing logic for each device of the multiple devices.

19 Claims, 6 Drawing Sheets

Capture Memory 370

| Communications TO DUT 351 | | | | |
|---|---|---|---|---|
| Timestamp 353 | channel 354 | Origin/destination 355 | Meta Data 356 | Data 357 |
| Timestamp 353 | channel 354 | Origin/destination 355 | Meta Data 356 | Data 357 |
| . . . | | | | |

| Communications FROM DUT 352 | | | | |
|---|---|---|---|---|
| Timestamp 353 | channel 354 | Origin/destination 355 | Meta Data 356 | Data 357 |
| Timestamp 353 | channel 354 | Origin/destination 355 | Meta Data 356 | Data 357 |
| . . . | | | | |

CAPTURE MEMORY ORGANIZATIONAL ARRANGEMENT 375

Capture Memory 376

| Communications TO DUT 351 | | | | |
|---|---|---|---|---|
| Timestamp 353 | channel 354 | Origin/destination 355 | Meta Data 356 | Data 357 |
| Timestamp 353 | channel 354 | Origin/destination 355 | Meta Data 356 | Data 357 |
| . . . | | | | |

Capture Memory 377

| Communications FROM DUT 352 | | | | |
|---|---|---|---|---|
| Timestamp 353 | channel 354 | Origin/destination 355 | Meta Data 356 | Data 357 |
| Timestamp 353 | channel 354 | Origin/destination 355 | Meta Data 356 | Data 357 |
| . . . | | | | |

FIG. 3C

REAL-TIME CAPTURE OF TRAFFIC UPON FAILURE FOR PROTOCOL DEBUG

RELATED APPLICATION(S)

This application is related to U.S. patent application Ser. No. 13/773,569, filed Feb. 11, 1013, entitled "Test Architecture Having Multiple FPGA Based Hardware Accelerator Blocks for Testing Multiple DUTs Independently," to Chan et al., which is hereby incorporated by reference herein in its entirety for all purposes.

FIELD OF INVENTION

Embodiments of the present invention generally relate to the field of electronic device testing systems, and more specifically to the systems and methods for providing debug functionality for such testing systems and the devices that are tested thereon.

BACKGROUND

Prior art testing techniques involve operating one or more devices under test (DUTs) over time in a controlled environment. For example, the temperature of the devices under test may be elevated relative to normal operating ranges to increase temperature related stress. Some test environments may utilize a highly capable protocol analyzer, placed between the DUT and the device tester. Upon a failure of the DUT, detailed failure information may be obtained because all communications between the DUT and the device tester may be recorded and analyzed by the protocol analyzer to determine the cause of the failure.

However, it is not commercially feasible to place a highly capable and expensive protocol analyzer between every device under test and its corresponding device tester. For example, a typical single device tester is configured to test many tens, or hundreds of devices under test. The cost of a corresponding number of highly capable protocol analyzers is prohibitive. In addition, it is generally not possible to physically locate and train technicians to use such a high number of highly capable protocol analyzers in a typical environmental chamber. Further, such external protocol analyzer testers are unable to capture data that is not exchanged with a device under test. For example, communications between a test system controller and other functional blocks of a test system are invisible to an external protocol analyzer. Accordingly, conventional mass testing systems generally do not utilize highly capable protocol analyzer testers.

Unfortunately, in accordance with the conventional art, little is known regarding the nature of a failure of a device under test. For example, available failure information may be limited to a time to failure, e.g., an elapsed time until failure. Even less may be known regarding the state of the tester system at the time of failure.

SUMMARY OF THE INVENTION

It would be highly valuable and desirable to obtain more information related to testing failures in a mass testing environment. More specifically, it is desirable to capture communications information leading up to a testing failure at a point within a test system. Further, it is desirable to determine if there was a communications protocol failure, a device mechanism failure, or other hardware-related failure.

Therefore, what is needed are systems and methods of real-time capture of traffic upon failure for protocol debug. What is additionally needed are systems and methods of real-time capture of traffic upon failure for protocol debug that capture communications information leading up to a testing failure at a point within a test system. What is further needed are systems and methods of real-time capture of traffic upon failure for protocol debug that are compatible and complementary with existing systems and methods of automated test equipment. Embodiments of the present invention provide these advantages and enhance the user's experience.

In accordance with an embodiment of the present invention, an automated test equipment for simultaneous testing of multiple devices includes a traffic capture circuit configured to capture communications with a device under test, a capture memory configured to store the communications captured by the traffic capture circuit, and routing logic configured to read the communications from the capture memory, e.g., random access memory (RAM). There may be one of each of the traffic capture circuit, the capture RAM, and the routing logic for each device of the multiple devices.

In accordance with another embodiment of the present invention, an automated test equipment apparatus includes a computer system including a system controller, the system controller communicatively coupled to a tester processor, wherein the system controller is operable to transmit instructions to the tester processor, and wherein the tester processor is operable to generate commands and data from the instructions for coordinating testing of a plurality of devices under test (DUTs), a plurality of FPGA components communicatively coupled to the tester processor via a bus, wherein each of the plurality of FPGA components comprises at least one hardware accelerator circuit operable to internally generate commands and data transparently from the tester processor for testing a respective DUT of a plurality of DUTs and a plurality of downstream ports, each for communicating with a respective DUT and each communicatively coupled to a respective FPGA of the plurality of FPGAs.

Each of the downstream ports further includes a traffic capture circuit configured to capture communications with a device under test, a capture RAM configured to store the communications captured by the traffic capture circuit, and routing logic configured to read the communications from the capture random access memory (RAM).

In accordance with a method embodiment of the present invention, a method includes capturing all communications between a test system and a device under test to form captured communications, and storing the captured communications into a capture memory. Responsive to a testing failure of the device under test, the storing is ceased. Responsive to the testing failure, the captured communications from the capture memory is read to a failure analysis function of a computer system. The captured communications are analyzed to determine a failure type, and a human readable report listing a failure type of the testing failure is generated.

BRIEF DESCRIPTION OF THE DRAWINGS

The accompanying drawings, which are incorporated in and form an integral part of this specification, illustrate embodiments of the invention and, together with the description, serve to explain the principles of the invention. Unless otherwise noted, the drawings are not drawn to scale.

FIG. 3C illustrates two exemplary organizational arrangements of capture memory, in accordance with embodiments of the present invention.

DETAILED DESCRIPTION

Figure 1:
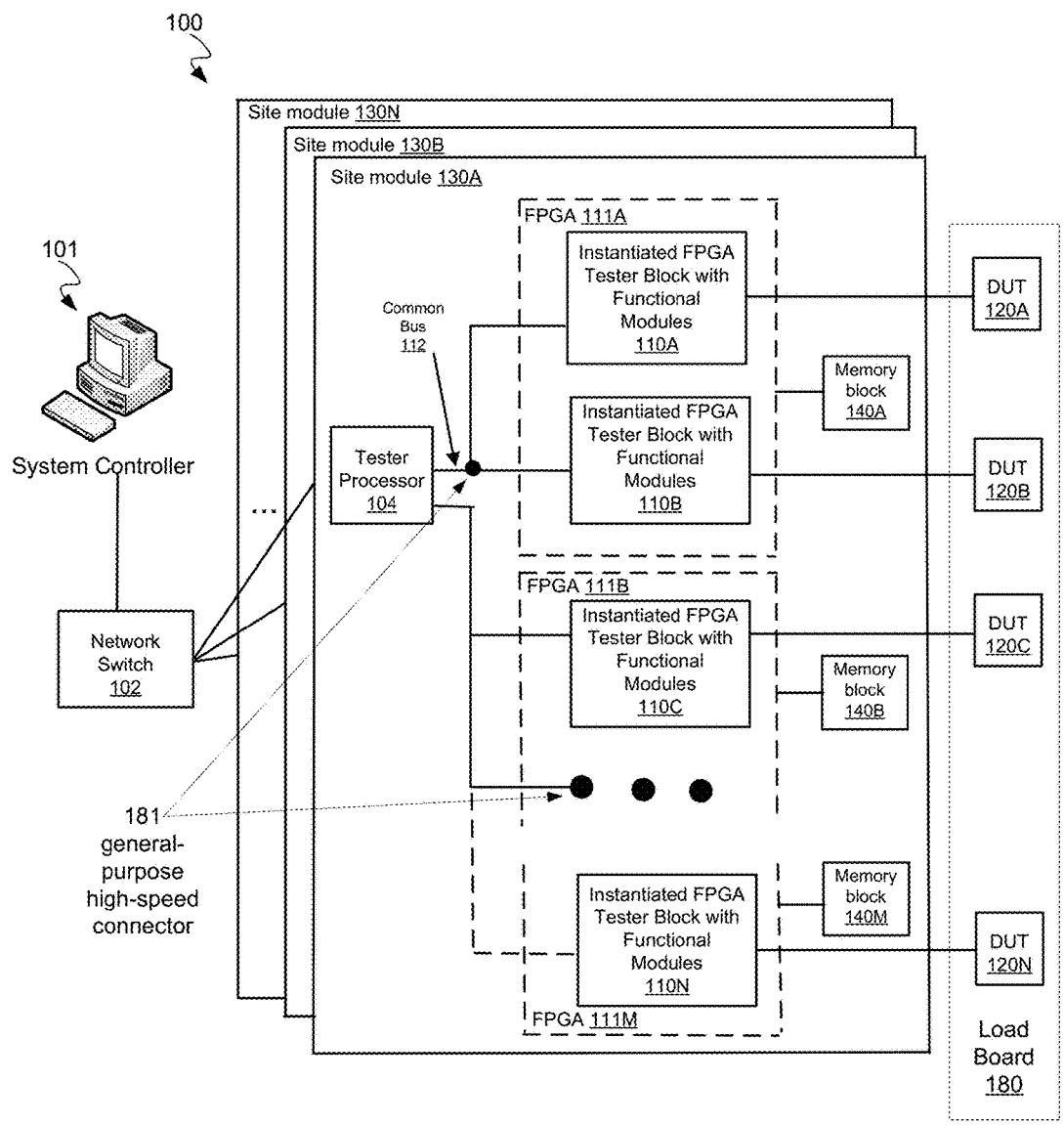
FIG. 1 illustrates an exemplary block diagram of an exemplary electronic test system, which may be used as a platform to implement embodiments of the present invention.

Reference will now be made in detail to various embodiments of the present invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Notation and Nomenclature

Some portions of the detailed descriptions which follow (e.g., method 400) are presented in terms of procedures, steps, logic blocks, processing, and other symbolic representations of operations on data bits that may be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, data, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "capturing" or "storing" or "reading" or "analyzing" or "generating" or "resolving" or "accepting" or "selecting" or "determining" or "displaying" or "presenting" or "computing" or "sending" or "receiving" or "reducing" or "detecting" or "setting" or "accessing" or "placing" or "testing" or "forming" or "mounting" or "removing" or "ceasing" or "stopping" or "coating" or "processing" or "performing" or "generating" or "adjusting" or "creating" or "executing" or "continuing" or "indexing" or "translating" or "calculating" or "measuring" or "gathering" or "running" or the like, refer to the action and processes of, or under the control of, a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The meaning of "non-transitory computer-readable medium" should be construed to exclude only those types of transitory computer-readable media which were found to fall outside the scope of patentable subject matter under 35 U.S.C. § 101 in In re Nuijten, 500 F.3d 1346, 1356-57 (Fed. Cir. 1007). The use of this term is to be understood to remove only propagating transitory signals per se from the claim scope and does not relinquish rights to all standard computer-readable media that are not only propagating transitory signals per se.

Real-Time Capture of Traffic Upon Failure for Protocol Debug

FIG. 1 illustrates an exemplary block diagram of an exemplary electronic test system 100, which may be used as a platform to implement embodiments of the present invention. System 100 may also be known as, or referred to as, Automatic Test Equipment or as an Automated Test Environment (ATE). In one embodiment, ATE apparatus 100 may be implemented within any testing system capable of testing multiple DUTs simultaneously. Devices to be tested may include, for example, integrated circuits, circuit boards comprising a myriad of integrated circuits and other electronic components, rotating magnetic media devices ("hard disk drives"), solid state drives ("SSDs"), and the like.

Referring to FIG. 1, an ATE apparatus 100 for testing devices, in accordance with an embodiment of the present invention includes a system controller 101, a network switch 102 coupling the system controller to the site module boards 130A-130N, FPGA devices 111A-111M comprising instantiated FPGA tester blocks 110A-110N, memory block modules 140A-140M wherein each of the memory blocks 140A-140M is coupled to one of the FPGA devices 111A-111M, and the devices under test (DUTs) 120A-120N, wherein each device under test 120A-120N is coupled to one of the instantiated FPGA tester blocks 110A-110N.

In one embodiment, the system controller 101 may be a computer system, e.g., a personal computer (PC) that provides a user interface for the user of the ATE to load the test programs and run tests for the DUTs coupled to the ATE 100. The Verigy Stylus™ Operating System is one example of test software often used during device testing. It provides the user with a graphical user interface from which to configure and control the tests. It can also comprise functionality to control the test flow, control the status of the test program, determine which test program is running, and log test results and other data related to test flow. In one embodiment, the system controller can be coupled to and control as many as 512 DUTs.

In one embodiment, the system controller 101 can be coupled to the site module boards 130A-130N through a network switch, such as an Ethernet switch. In other embodiments, the network switch may be compatible with a different protocol such as Fibre Channel, 802.11, ATM and/or PCIe, for instance.

In one embodiment, each of the site module boards 130A-130N may be a separate standalone board used for purposes of evaluation and development that attaches to custom-built load board fixtures, e.g., load board 180, on which the DUTs 120A-120N are loaded, and also to the system controller 101 from where the test programs are received. In other embodiments, the site module boards may be implemented as plug-in expansion cards or as daughter boards that plug into the chassis of the system controller 101 directly.

The site module boards 130A-130N can each comprise at least one tester processor 104 and at least one FPGA device. The tester processor 104 and the FPGA devices 111A-111M on the site module board run the test methods for each test case in accordance with the test program instructions received from the system controller 101. In one embodiment the tester processor can be a commercially available Intel 8086 CPU or any other well-known processor. Further, the tester processor may be operating on the Ubuntu OS x64 operating system and running the Core Software, which allows it to communicate with the Stylus software running on the system controller, to run the test methods. The tester processor 104 controls the FPGA devices on the site module and the DUTs coupled to the site module based on the test program received from the system controller.

The tester processor 104 is coupled to and can communicate with the FPGA devices 111A-111M over bus common bus 112. In one embodiment, tester processor 104 communicates with each of the FPGA devices 111A-111M over a separate dedicated bus. In one embodiment, tester processor 104 can control the testing of the DUTs 120A-120N transparently through the FPGAs with minimal processing functionality allocated to the FPGA devices. In this embodiment, the data traffic capacity of bus 112 can be exhausted rapidly because all the commands and data generated by the tester processor need to be communicated over the bus to the FPGA devices. In other embodiments, the tester processor 104 can share the processing load by allocating functionality to control the testing of the DUTs to the FPGA devices. In these embodiments, the traffic over bus 112 is reduced because the FPGA devices can generate their own commands and data.

In one embodiment, each of the FPGA devices 111A-111M is coupled to its own dedicated memory block 140A-140M. These memory blocks can, among other things, be utilized to store the test pattern data that is written out to the DUTs. In one embodiment, each of the FPGA devices can comprise two instantiated FPGA tester blocks 110A-110B with functional modules for performing functions including implementation of communicative protocol engines and hardware accelerators as described further herein. Memory blocks 140A-140 M can each contain one or more memory modules, wherein each memory module within the memory block can be dedicated to one or more of the instantiated FPGA tester blocks 110A-110B. Accordingly, each of the instantiated FPGA tester blocks 110A-110B can be coupled to its own dedicated memory module within memory block 140A. In another embodiment, instantiated FPGA tester blocks 110A and 110B can share one of the memory modules within memory block 140A.

Further, each of the DUTs 120A-120N in the system can be coupled to a dedicated instantiated FPGA tester block 110A-110N in a "tester per DUT" configuration, wherein each DUT gets its own tester block. This allows separate test execution for each DUT. The hardware resources in such a configuration are designed in a manner to support individual DUTs with minimal hardware sharing. This configuration also allows many DUTs to be tested in parallel, where each DUT can be coupled to its own dedicated FPGA tester block and be running a different test program.

The architecture of the embodiment of the present invention depicted in FIG. 1 has several advantages. First, it eliminates the need for protocol-specific hardware bus adapter ("HBA") sockets and cards in the system because the communication protocol modules can be programmed directly on the instantiated tester blocks within the FPGA devices. The instantiated tester blocks can be configured to communicate with the DUTs in any protocols that the DUTs support. Accordingly, if DUTs with different protocol support need to be tested, they can be coupled to the same system and the FPGAs can be reprogrammed with support for the associated protocols. As a result, one ATE body can be easily configured to test DUTs supporting many different types of protocols.

In one embodiment, new protocols can be downloaded and installed directly on the FPGAs via a simple bit-stream download from a cache on system controller 101 without any kind of hardware interactions. For example, the FPGAs 111A-111M in the ATE apparatus 100 can be configured with the PCIe protocol to test PCIe devices initially and subsequently reconfigured via a software download to test SATA devices. Also, if a new protocol is released, the FPGAs can easily be configured with that protocol via a bit-stream download instead of having to physically switch all the hardware bus adapter cards in the system. Finally, if a non-standard protocol needs to be implemented, the FPGAs can nonetheless be configured to implement such a protocol.

In another embodiment, the FPGAs 111A-111M can be configured, e.g., programmed, to run more than one communicative protocol, wherein these protocols also can be downloaded from system controller 101 and configured through software. For example, instantiated FPGA tester block 110A can be configured to run the PCIe protocol while instantiated FPGA tester block 110B can be configured to run the SATA protocol. This allows the tester hardware to test DUTs supporting different protocols simultaneously. FPGA 111A can now be coupled to test a DUT that supports both PCIe and SATA protocols. Alternatively, it can be coupled to test two different DUTs, one DUT supporting the PCIe protocol, and the other DUT supporting the SATA protocol.

Another advantage of the architecture presented in FIG. 1 is that it reduces processing load on the tester processor 104 by distributing the command and test pattern generating functionality to FPGA devices, where each DUT has a dedicated FPGA module running the test program specific to it. For instance, instantiated FPGA tester block 110A is coupled to DUT 120A and runs test programs specific to DUT 120A. The hardware resources in such a configuration are designed in a manner to support individual DUTs with minimal hardware sharing. This "tester per DUT" configuration also allows more DUTs to be tested per processor and more DUTs to be tested in parallel. Furthermore, with the FPGAs capable of generating their own commands and test patterns in certain modes, the bandwidth requirements on bus 112 coupling the tester processor with the other hardware components, including FPGA devices, device power supplies (DPS) and DUTs, is also reduced. As a result more DUTs can be tested simultaneously than in prior configurations.

Figure 2:
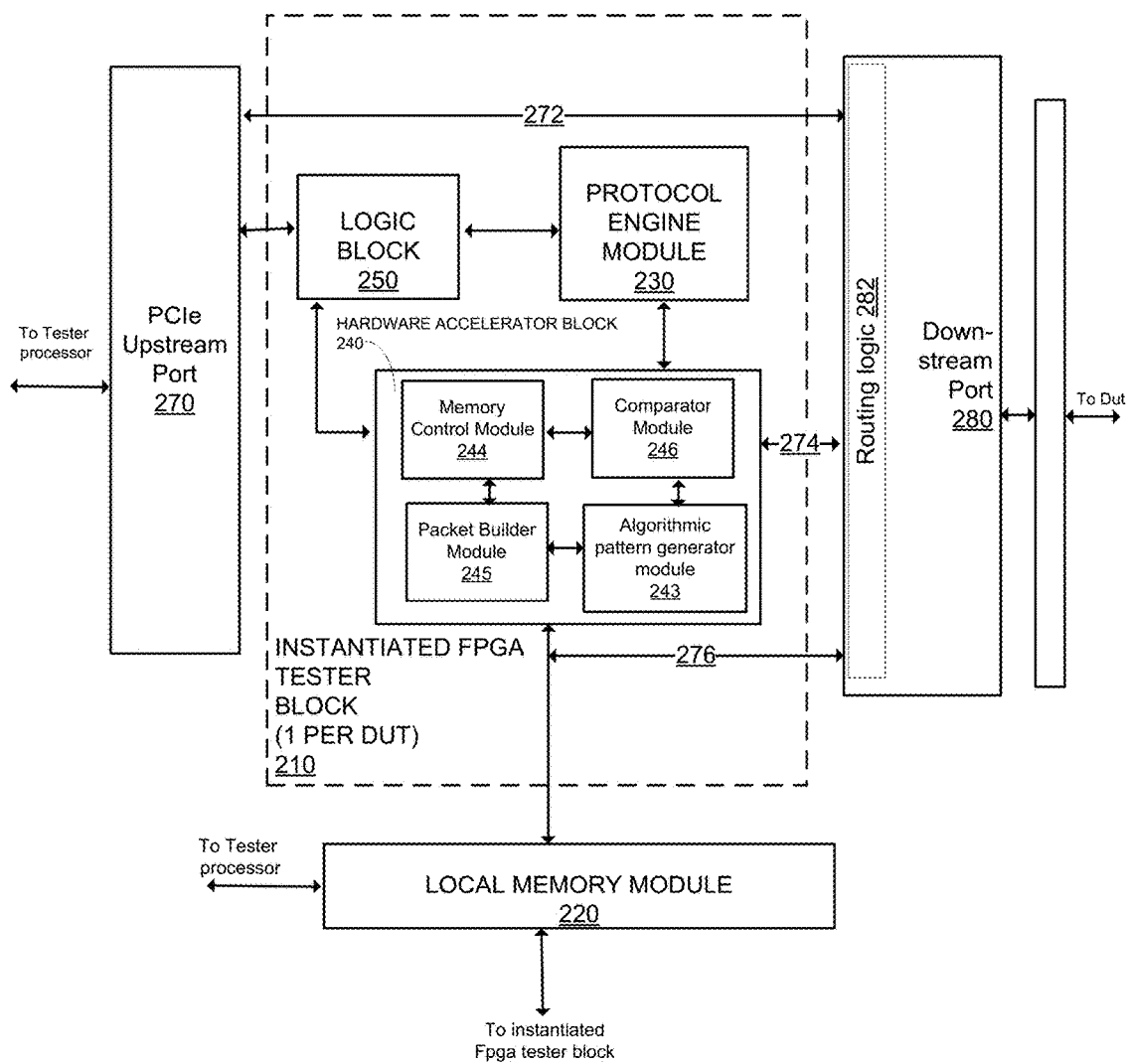
FIG. 2 is a detailed schematic block diagram of an exemplary instantiated FPGA tester block, according to an embodiment of the present invention.

FIG. 2 is a detailed schematic block diagram of an exemplary instantiated FPGA tester block of FIG. 2, according to an embodiment of the present invention.

Referring to FIG. 2, the instantiated FPGA tester block 210 is connected to the tester processor through PCIe upstream port 270 and to the DUT, e.g., DUT 120A of FIG. 1, through downstream port 280. It is appreciated that downstream port 280 is configured to communicate with a device under test, and may implement any required interface, including bus interfaces, for example, PCIe, ATA, SATA, NVMe, USB, SPI, JTAG, and/or SAS.

Instantiated FPGA block 210 can comprise a protocol engine module 230, a logic block module 250, and a hardware accelerator block 240. The hardware accelerator block 240 can further comprise a memory control module 244, comparator module 246, a packet builder module 245, and an algorithmic pattern generator (APG) module 243.

In one embodiment, logic block module 250 comprises decode logic to decode the commands from the tester processor, routing logic to route all the incoming commands and data from the tester processor 104 and the data generated by the FPGA devices to the appropriate modules, and arbitration logic to arbitrate between the various communication paths within instantiated FPGA tester block 210.

In one embodiment, the communication protocol used to communicate between the tester processor and the DUTs can advantageously be reconfigurable. The communicative protocol engine in such an implementation may be programmed directly into the protocol engine module 230 of instantiated FPGA tester block 210, in some embodiments. The instantiated FPGA tester block 210 can therefore be configured to communicate with the DUTs in any protocol that the DUTs support. This advantageously eliminates a need for hardware bus adapter cards, and no protocol-specific hardware needs be replaced to test DUTs with different protocol support. In one embodiment, the protocols can be high-speed serial protocols, including but not limited to SATA, SAS, or PCIe, etc. The new or modified protocols can be downloaded and installed directly on the FPGAs via a simple bit-stream download from the system controller through the tester processor without any kind of hardware interactions. Also, if a new protocol is released, the FPGAs can easily be configured with that protocol via a software download.

In FIG. 2, if the DUT coupled to the downstream port 280 is a PCIe device, for example, a bit-file containing the instantiation of the PCIe protocol may be downloaded, for example, through a JTAG interface to the FPGA devices 111A-111M. Each FPGA device 111A or 111B (FIG. 1) can comprise one or more instantiated FPGA tester blocks and, consequently, one or more protocol engine modules. The number of protocol engine modules that any one FPGA device can support is limited only by the size and gate count of the FPGA.

In one embodiment of the present invention, each of the protocol engine modules within a FPGA device can be configured with a different communicative protocol. Accordingly, an FPGA device can be connected to test multiple DUTs, each supporting a different communicative protocol simultaneously. Alternatively, an FPGA device can be connected to a single DUT supporting multiple protocols and test all the modules running on the device simultaneously. For example, if an FPGA is configured to run both PCIe and SATA protocols, it can be connected to test a DUT that supports both PCIe and SATA protocols. Alternatively, it can be connected to test two different DUTs, one DUT supporting the PCIe protocol, and the other DUT supporting the SATA protocol.

The hardware accelerator block 240 of FIG. 2 can be used to expedite certain functions on FPGA hardware than would be possible to do in software on the tester processor. The hardware accelerator block 240 can supply the initial test pattern data used in testing the DUTs. It can also contain functionality to generate certain commands used to control the testing of the DUTs. To generate test pattern data, accelerator block 240 uses the algorithmic pattern generator module 243.

The hardware accelerator block 240 can use comparator module 246 to compare the data being read from the DUTs to the data that was written to the DUTs in a prior cycle. The comparator module 246 comprises functionality to flag a mismatch to the tester processor 104 to identify devices that are not in compliance. More specifically, the comparator module 246 can comprise an error counter that keeps track of the mismatches and communicates them to the tester processor 304.

Hardware accelerator block 240 can connect to a local memory module 220. Memory module 220 performs a similar function to a memory module within any of the memory blocks 240A-240M. Memory module 220 can be controlled by both the hardware accelerator block 240 and the tester processor 104 (FIG. 1). The tester processor 104 can control the local memory module 220 and write the initial test pattern data to it.

The memory module 220 stores the test pattern data to be written to the DUTs and the hardware accelerator block 240 accesses it to compare the data stored to the data read from the DUTs after the write cycle. The local memory module 220 can also be used to log failures. The memory module would store a log file with a record of all the failures the DUTs experienced during testing. In one embodiment, the accelerator block 240 has a dedicated local memory module block 220 that is not accessible by any other instantiated FPGA tester blocks. In another embodiment, the local memory module block 220 is shared with a hardware accelerator block in another instantiated FPGA tester block.

Hardware accelerator block 240 can also comprise a memory control module 244. The memory control module 244 interacts with and controls read and write access to the memory module 220.

The hardware accelerator block 240 comprises a packet builder module 245. The packet builder module is used by the hardware accelerator block in certain modes to construct packets to be written out to the DUTs comprising header/command data and test pattern data.

In certain embodiments, hardware accelerator block 240 can be programmed by the tester processor 104 to operate in one of several modes of hardware acceleration. In bypass mode, the hardware accelerator is bypassed and commands and test data are sent by the tester processor 104 directly to the DUT through path 272. In hardware accelerator pattern generator mode, test pattern data is generated by the APG module 243 while the commands are generated by the tester processor 304. The test packets are transmitted to the DUT through path 274. In hardware accelerator memory mode, the test pattern data is accessed from local memory module 220 while the commands are generated by the tester processor 304. The test pattern data is transmitted to the DUT through path 276. Routing logic 282 is configured to arbitrate among paths 272, 274 and 276 to control the flow of data to the DUT.

The site module can comprise a plurality of general-purpose connectors 181. Because the protocol engine module 230 can be configured to run any number of various communicative protocols, a general-purpose high-speed connector 181 may be required on the site module. Accordingly, if the protocol implemented on the protocol engine module 230 needs to be changed, no accompanying physical modification needs to be made on the site module. The site module connects to the DUT using a load board, e.g., load board 180 of FIG. 1, that can connect to the general-purpose connector 181 on the site module end, but is specific to the protocol and connectors being implemented on the DUT end. DUTs supporting different communicative protocols will require different configurations. Accordingly, the load board may need to be switched out and replaced if the protocol is reprogrammed to accommodate DUTs requiring a different configuration.

Figure 3A:
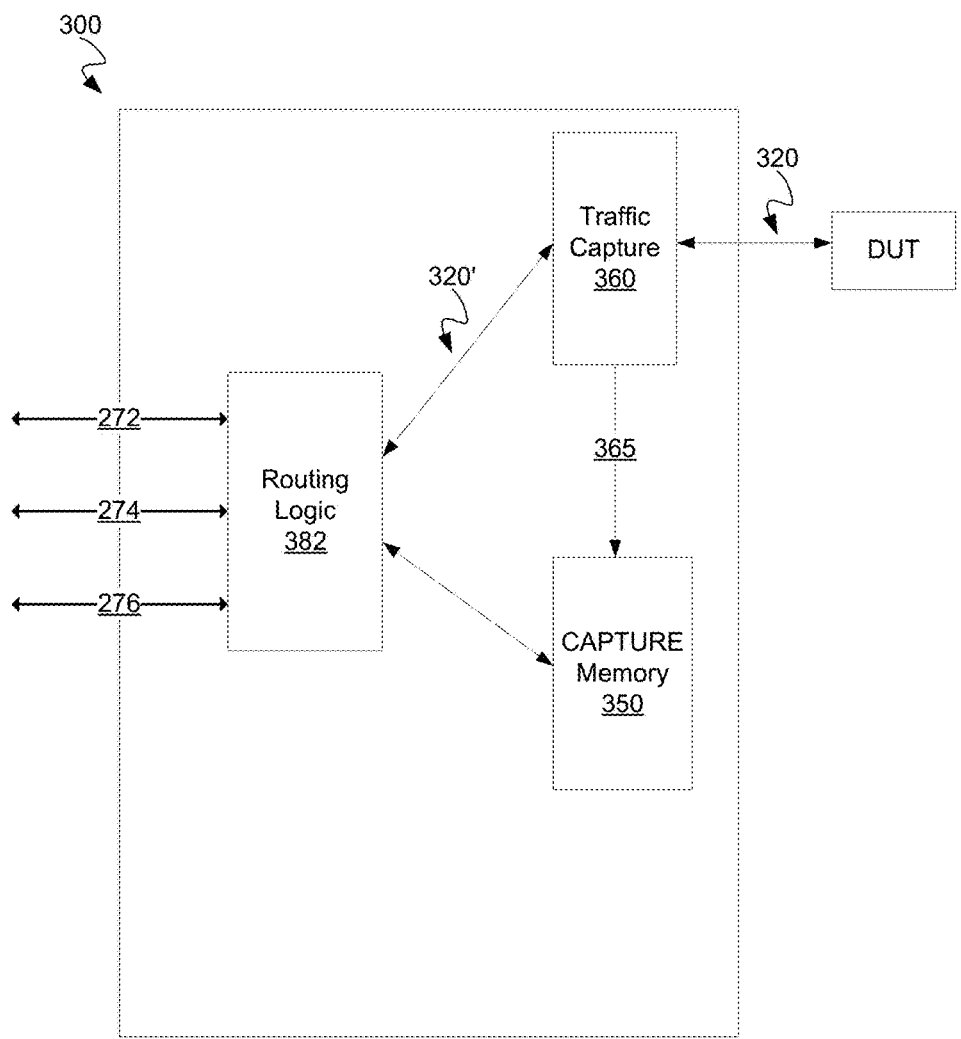
FIG. 3A illustrates details of an exemplary downstream port, in accordance with embodiments of the present invention.

FIG. 3A illustrates details of an exemplary data capture system 300, in accordance with embodiments of the present invention. Data capture system 300 may be physically and/or functionally located in any suitable location providing access to communications with a device under test. For example, data capture system 300 may be located within a downstream port, e.g., downstream port 280 of FIG. 2. Alternatively, data capture system 300 may be located within an instantiated FPGA tester block, e.g., instantiated FPGA tester block of FIG. 2. In general, there is one instance of data capture system 300 for each device under test. It is appreciated that data capture system 300 is configured to communicate with a device under test, and may implement any required interface, including serial and/or parallel bus interfaces, for example, PCIe, ATA, SATA, NVMe, USB, SPI, JTAG, and/or SAS.

Data capture system 300 comprises a traffic capture circuit 360. Traffic capture circuit 360 monitors communication 320 with the DUT, e.g., DUT 120A of FIG. 1. In some embodiments, traffic capture circuit 360 is transparent to communication 320. For example, traffic capture circuit 360 does not alter communication 320 between a DUT and other elements of data capture system 300, e.g., communications paths 272, 274, and/or 276. For example, communication 320 is substantially identical to communication 320'. Traffic capture circuit 360 "snoops" communication 320 with the DUT, and stores the communications, at 365, into capture memory 350, which may, for example, be a random access memory (RAM) structure and/or device.

Traffic captured and stored into capture memory 350 may include communications 320 with the DUT as well as meta data that is not sent and/or received from the DUT. Meta data may include configuration information related to instantiated FPGA tester block(s), for example. Exemplary information captured and stored into capture memory 350 may include, for example, read/write data, protocol commands, acknowledgement status information, failure reporting, link status, routing information, and the like, for communications 272, 274, 276 and/or 320, in accordance with embodiments of the present invention.

The actual format of the data stored in capture memory 350, e.g., data framing, language syntax, etc., generally varies by the protocol of the communications 272, 274, 276, and/or 320, and information may be stored in any suitable format in capture memory 350. In some embodiments, traffic capture circuit 360 may mark the communications 272, 274, 276, and/or 320 data with a time stamp as the data is stored into capture memory 350. Traffic capture circuit 360 may also mark and/or separate the communications 272, 274, 276 and/or 320 with information of origin and or destination, e.g., including which data path 272, 274 and/or 276 was utilized, of communications 320 as the information is stored into capture memory 350, in some embodiments.

In some embodiments, capture memory 350 may be partitioned into a first partition for recording data transmitted to the DUT 120A, and a second partition for recording data received from the DUT 120A. In other embodiments, the capture memory 350 may comprise distinct memory structures and/or memory devices for storing transmitted and received data.

Traffic capture circuit 360 continuously sends transmit and receive traffic 320 to BAM 350. As capture memory 350 has a fixed storage capacity, the information stored within capture memory 350 is continuously updated, e.g., as a circular buffer.

Upon detection of an error in testing of the DUT, communications 320 with the DUT is generally stopped. Alternatively, a limited amount of communication with the DUT may occur, for example, to retrieve error codes or other status information from the DUT. Upon cessation of traffic 320, capture memory 350 comprises a history of traffic 320 prior the stoppage, e.g., prior to the failure.

Data capture system 300 comprises routing logic 382. Routing logic 382 enables instantiated FPGA tester block 210 to communicate with the DUT, e.g., via traffic capture circuit 360, or to communicate with capture memory 350. Routing logic 382 enables the contents of capture memory 350 to be read, e.g., by system controller 101 (FIG. 1), for example, via communications 272. For example, the contents of capture memory 350 may be read, via routing logic 382, by system controller 101 after a failure in testing the DUT.

In some embodiments, some or all of a test system may "freeze," or cease operations upon a failure. For example, site module 130A may cease testing operations. In such a case, capture memory 350 may be inspected and/or its data retrieved, upon restarting, e.g., re-booting, the test system or test system portion.

System controller 101 may comprise a protocol failure analysis function, e.g., a software module for protocol failure analysis. The protocol failure analysis function may understand all supported test and DUT-communication protocols. The protocol failure analysis function may generally be further capable of determining a failure type based on analysis of the captured data retrieved from capture memory 350. By examining the history of communication between the test system and the DUT, the failure analysis function may be able to determine the cause of a DUT failure, e.g., a protocol failure, a bad flash bit failure, failure of garbage collection, other types of hardware failures, etc. Such information may be used to produce a failure report for a customer, for example.

In accordance with embodiments of the present invention, a failure report may also, or alternatively, include all of the captured raw data from capture RAM350 so that a customer can examine the data directly, e.g., for fault determination and/or debug, in accordance with the customer's analysis.

It is to be appreciated that embodiments in accordance with the present invention are well suited to capturing and analyzing data associated with numerous failure types, including, for example, failures unrelated to the actions of a device under test (DUT). For example, if a PCIe link were to enter a PCIe link training period during testing of a DUT, such an action may prevent the timely exchange of commands and/or data with a DUT. This may appear, e.g., to a tester processor 104 and/or a system controller 101 (FIG. 1), as a DUT testing failure, e.g., it may appear that the DUT did not respond to a command.

In accordance with embodiments of the present invention, under the above scenario, contents of capture memory 350 may demonstrate that the DUT performed correctly, and that the failure occurred elsewhere in the system. Further, capture of protocol communications of communications 272, 274, and/or 276 into capture memory 350 may indicate that a link entered a training period, resulting in the test error.

Figure 3B:
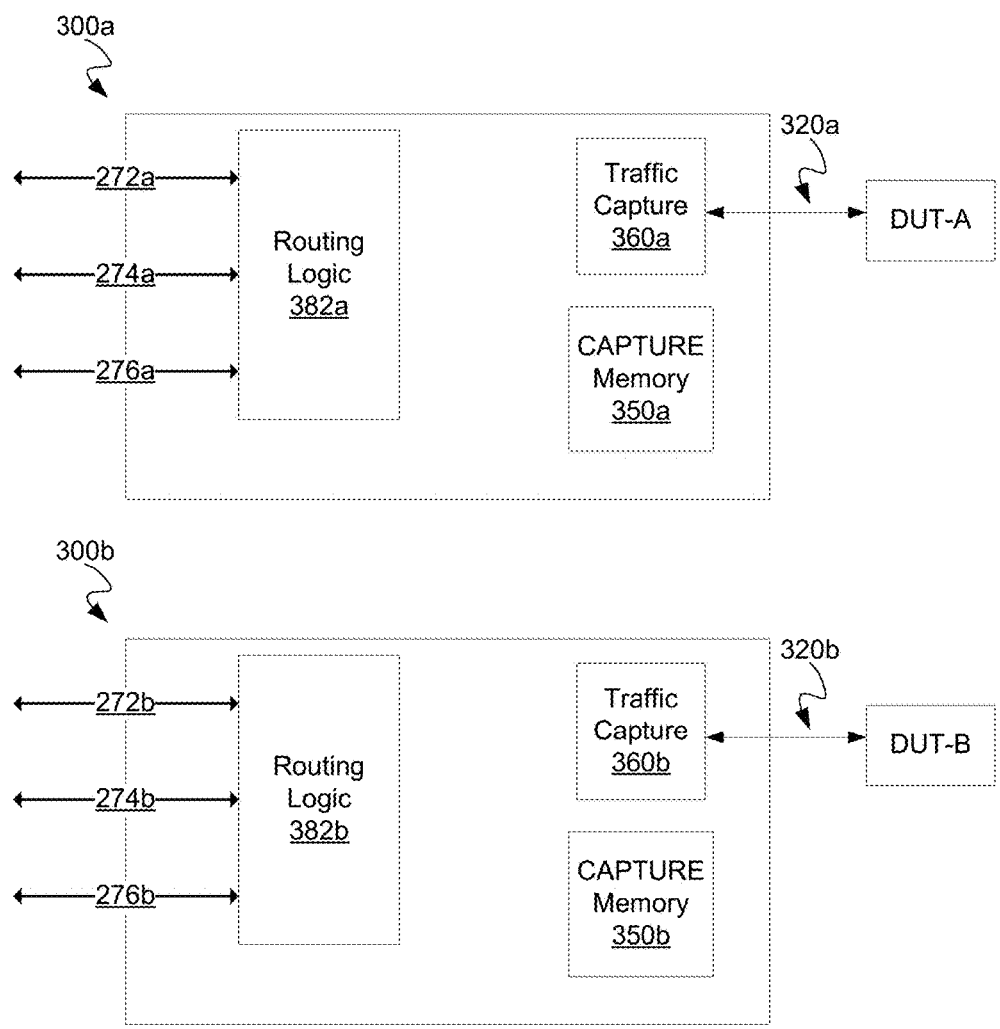
FIG. 3B illustrates multiple instances of an exemplary data capture systems, in accordance with embodiments of the present invention.

FIG. 3B illustrates multiple instances of an exemplary data capture systems, in accordance with embodiments of the present invention. As previously presented, there is generally one instance of data capture system 300 for each device under test, and one instance of data capture system 300 for each instantiated FPGA tester block, e.g. instantiated FPGA tester blocks 110A through 110N of FIG. 1. FIG. 3B illustrates a data capture system 300a associated with device under test (DUT) "A." Corresponding to data capture system 300 of FIG. 3A, data capture system 300a may be physically and/or functionally located in any suitable location providing access to communications with a device under test.

Data capture system 300a comprises a traffic capture circuit 360a. Traffic capture circuit 360a monitors communication 320a with the DUT-A, e.g., DUT 120A of FIG. 1. In some embodiments, traffic capture circuit 360a is transparent to communication 320a. For example, traffic capture circuit 360 does not alter communication 320a between a DUT and other elements of data capture system 300a, e.g., communications paths 272a, 274a, and/or 276a. Traffic capture circuit 360a "snoops" communication 320a with the DUT-A, and stores the communications into capture memory 350a, which may, for example, be a random access memory (RAM) structure and/or device.

A correspondingly similar data capture system 300b is provided for communications with a second device under test, DUT-B. It is to be appreciated that, in general, elements of data capture system 300b are separate and function independently of data capture system 300a. For example, in general, capture memory 350b is not burdened with communications of DUT-A.

FIG. 3C illustrates two exemplary organizational arrangements of capture memory 350, in accordance with embodiments of the present invention. In exemplary capture memory organizational arrangement 370, a capture memory, e.g., capture memory 350 of FIG. 3, the communications data 357 may be marked with a timestamp 353, and an indication of the communications channel 354. For example, the indication of the communications channel 354 may indicate which of the communications channels 272, 274, 276 (FIG. 2) coupled the communications data 357 to the device under test, or which of the communications channels 272, 274, 276 was intended to receive the communications data 357 from the device under test.

The communications data 357 may also be associated with information of the destination and/or origin 355 of the communications data 357. Destination and/or origin information 355 may indicate, for example, whether the communications data 357 originated with, or was intended for, system controller 101, tester processor 104, instantiated FPGA tester blocks 110A to 110N, FPGAs 111A to 111M, network switch 102, site modules 130A to 130N, memory blocks 140A to 140M, load board 180, DUTs 120A to 120N of FIG. 1, PCIe ports 270 and/or 280, logic block 250, protocol engine module 230 and/or hardware accelerator block 240 of FIG. 2, in some embodiments.

In addition, the communications data 357 may also be associated with meta data 356. Further, exemplary capture memory organizational arrangement 370 is partitioned into communications directed to the device under test 351, and communications received from the device under test 352.

In exemplary capture memory organizational arrangement 375, the capture memory, e.g., capture memory 350 of FIG. 3, comprises two separate memory structures and/or memory devices for storing transmitted and received data. Capture memory structure or device 376

Figure 4:
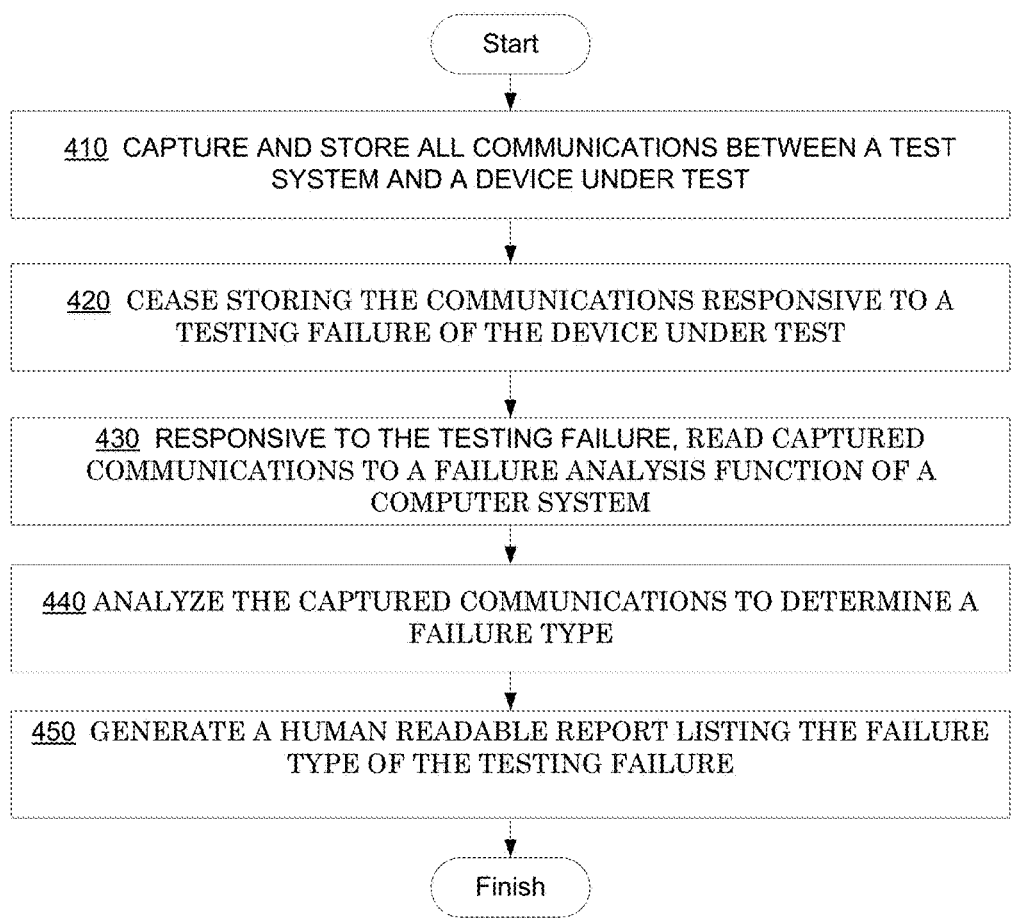
FIG. 4 illustrates an exemplary method of capturing and reporting communications information for failure analysis and debug, in accordance with embodiments of the present invention.

FIG. 4 illustrates an exemplary method 400 of capturing and reporting communications information for failure analysis and debug, in accordance with embodiments of the present invention. In 410, all communications between a test system and a device under test are captured and stored, e.g., into capture memory 350 of FIG. 3A. In 420, the storing of communications is ceased responsive to a testing failure of the device under test or in response to a user initiated command. In 430, responsive to the failure or user initiated commend, or responsive to a system reboot, the computer communications are read to a failure analysis function of a computer system. The failure analysis function may be a software program product, in some embodiments.

In 440, the captured communications are analyzed to determine a failure type. It is appreciated that not all failure types are necessarily caused by failures of a device under test. In 450, a human readable report listing the failure type is generated. The human readable report may take any suitable form, including, for example, a video display and/or printed on paper. In the human readable report different data types and meta data may be separated as well as data from different communication ahts and/or related to different DUTs.

Embodiments in accordance with the present invention provide systems and methods of real-time capture of traffic upon failure for protocol debug. In addition, embodiments in accordance with the present invention provide systems and methods of real-time capture of traffic upon failure for protocol debug that capture communications information leading up to a testing failure at a point within a test system. Further, embodiments in accordance with the present invention provide systems and methods of real-time capture of traffic upon failure for protocol debug that are compatible and complementary with existing systems and methods of automated test equipment.

Various embodiments of the invention are thus described. While the present invention has been described in particular embodiments, it should be appreciated that the invention should not be construed as limited by such embodiments, but rather construed according to the below claims.

What is claimed is:

1. An automated test equipment for simultaneous testing of multiple devices, comprising:
   a traffic capture circuit configured to capture all communications with a device under test;
   a capture memory configured to store said all communications captured by said traffic capture circuit;
   a routing logic configured to read said communications from said capture memory; and
   tester logic operable to generate meta data of communications that are not sent to the device under test.

2. The automated test equipment of claim 1 further comprising one of each of said traffic capture circuit, said capture memory, and said routing logic for each device of said multiple devices.

3. The automated test equipment of claim 1 wherein said routing logic is further configured to route more than one communications channel to said device under test.

4. The automated test equipment of claim 1 wherein said capture memory is partitioned into a first partition for recording communications transmitted to the device under test, and a second partition for recording communications received from the device under test.

5. The automated test equipment of claim 1 wherein said capture memory comprises distinct memory structures for storing communications transmitted to said device under test, and for storing communications received from said device under test.

6. The automated test equipment of claim 1 wherein said traffic capture circuit is further configured to apply a time stamp to said communications captured by said traffic capture circuit for storing in said capture memory.

7. The automated test equipment of claim 1 wherein said traffic capture circuit and said routing logic are further configured to store the communications meta data.

8. An automated test equipment (ATE) apparatus comprising:
- a computer system comprising a system controller, said system controller communicatively coupled to a tester processor, wherein said system controller is operable to transmit instructions to said tester processor, and wherein said tester processor is operable to generate commands and data from said instructions for coordinating testing of a plurality of devices under test (DUTs);
- a plurality of field-programmable gate array (FPGA) components communicatively coupled to said tester processor via a bus, wherein each of said plurality of FPGA components comprises at least one hardware accelerator circuit operable to internally generate commands and data transparently from said tester processor for testing a respective DUT of a plurality of DUTs;
- a plurality of downstream ports, each for communicating with a respective DUT and each communicatively coupled to a respective FPGA of said plurality of FPGAs,
- wherein each said downstream port further comprises:
- a traffic capture circuit configured to capture all communications with said respective device under test;
- a capture random access memory (RAM) configured to store said all communications captured by said traffic capture circuit;
- tester logic operable to generate meta data of communications that are not sent to and are not received from the DUT; and
- a routing logic configured to read said communications from said capture RAM.

9. The automated test equipment of claim 8 wherein each said downstream port is configured to communicate with at least two communication channels to said respective FPGA.

10. The automated test equipment of claim 9 wherein said routing logic is further configured to route said at least two communication channels to said device under test.

11. The automated test equipment of claim 8 wherein said capture RAM is partitioned into a first partition for recording communications transmitted to the device under test, and a second partition for recording communications received from the device under test.

12. The automated test equipment of claim 8 wherein said capture RAM comprises distinct RAM structures for storing communications transmitted to said device under test, and for storing communications received from said device under test.

13. The automated test equipment of claim 8 wherein said traffic capture circuit is further configured to apply a time stamp to said communications captured by said traffic capture circuit for storing in said capture RAM.

14. The automated test equipment of claim 8 wherein said traffic capture circuit and said routing logic are further configured to store the communications meta data.

15. A method comprising:
- generating meta data of communications that are not sent to and are not received from a device under test;
- capturing said meta data and all communications between a test system and the device under test to form captured communications;
- storing said captured communications into a capture memory that is part of said test system;
- responsive to a testing failure of the device under test, ceasing said storing;
- responsive to said testing failure, reading said captured communications from said capture memory to a failure analysis function of a computer system;
- analyzing the captured communications to determine a failure type; and
- generating a human readable report listing a failure type of the testing failure.

16. The method of claim 15 wherein said capturing and said storing take place simultaneously for a plurality of devices under test.

17. The method of claim 15 wherein said captured communications stored in said capture memory comprise a time stamp corresponding to each communication that was captured.

18. The method of claim 15 wherein said capturing is transparent to said communications between said test system and said device under test.

19. The method of claim 15 wherein said failure type includes test system failures caused independently from an operation of a device under test.

* * * * *